(12) United States Patent
Wang (10) Patent No.: US 8,866,765 B2
(45) Date of Patent: Oct. 21, 2014

(54) LIGHT EMITTING UNIT, MANUFACTURING METHOD THEREOF AND TOUCH PANEL HAVING THE SAME

(75) Inventor: You-Fa Wang, Singapore (SG)

(73) Assignee: Lite-On Singapore Pte. Ltd., Midview (SG)

( * ) Notice: Subject to any disclaimer, the term of this patent is extended or adjusted under 35 U.S.C. 154(b) by 239 days.

(21) Appl. No.: 13/269,613

(22) Filed: Oct. 9, 2011

(65) Prior Publication Data
US 2013/0088436 A1 Apr. 11, 2013

(51) Int. Cl.
*G06F 3/041* (2006.01)
*H01L 25/075* (2006.01)
*G06F 3/042* (2006.01)
*H01L 33/58* (2010.01)

(52) U.S. Cl.
CPC .......... *G06F 3/0421* (2013.01); *H01L 25/0753* (2013.01); *H01L 33/58* (2013.01)
USPC ........................................................ 345/173

(58) Field of Classification Search
None
See application file for complete search history.

(56) References Cited

U.S. PATENT DOCUMENTS

| | | | |
|---|---|---|---|
| 2004/0080938 A1* | 4/2004 | Holman et al. | 362/231 |
| 2010/0155586 A1* | 6/2010 | Chin et al. | 250/231.1 |
| 2012/0112220 A1* | 5/2012 | West et al. | 257/98 |

* cited by examiner

*Primary Examiner* — Adam R Giesy
*Assistant Examiner* — Henok Heyi
(74) *Attorney, Agent, or Firm* — Li & Cai Intellectual Property (USA) Office (57) ABSTRACT

A manufacturing method of light emitting units is shown below. First step is providing a substrate with multi circuit areas. A light emitting diode is mounted on the circuit area respectively. Next step is forming a package structure to cover the light emitting diode. Next step is dicing the package structure to form a biconic package structure. The package structure is diced twice in two directions, respectively. As above-mentioned, the light emitting unit has asymmetric light radiation pattern.

8 Claims, 7 Drawing Sheets

LIGHT EMITTING UNIT, MANUFACTURING METHOD THEREOF AND TOUCH PANEL HAVING THE SAME

BACKGROUND OF THE INVENTION

1. Field of the Invention

The present invention relates to a light emitting unit, a manufacturing method thereof and a touch panel having the same. In particular, the present invention relates to a light emitting unit having an asymmetric light pattern.

2. Description of Related Art

Depending on the design of the electronic product, the electronic product is controlled by the input devices such as a key, a keypad, a tracking ball, or a touch panel screen. Recently, the touch panel screen has been widely used in electronic applications. The touch panel screen includes a touch panel which has a transparent panel with a sensitive surface to cover the displaying area of the screen. Users can select the items or move the cursor by using a finger or a touch pen on the touch panel screen so that the electronic device is controlled by the touch signals from the touch panel screen. For example, an IR proximity sensor is widely used in mobile communication devices, such as IR touch panel, for detecting the face of users so as to control the mobile communication device.

The IR touch panel has LEDs and receivers arranged on four sides of the screen. The lights emitted from LEDs construct a net of IR. Thus, when user's finger is blocking one or more of the lights, the position of the finger relative to the screen can be determined. However, the traditional SMD LEDs have symmetric lighting pattern in two directions; therefore, the view angles at X axis and Y axis of the screen are usually equal to each other. The LEDs having symmetric lighting pattern is not suitable for the touch panel, because the touch panel only detects the object in one direction, i.e., the user' finger closes to the screen substantially from the front side (Y axis) of the screen. Thus, the lights project at the right and left sides (X axis) of the screen have no function. Even more, the symmetric lighting pattern at axis and Y axis may induce the signal crosstalk which results in the short detecting distance of the touch screen. User's finger has to close to screen to position his finger if the touch screen has a short detecting distance. In other words, the detecting sensitivity is reduced. Furthermore, the touch screen may be scratched by the user and the lifetime of the screen is reduced.

On the other hand, the light intensity is divided to the X axis and Y axis equally in the traditional LEDs; therefore, the light brightness toward the user's eyes at Y axis of the screen is low. In other words, the lights project toward the user's eyes does not have enough brightness when user watches the screen.

SUMMARY OF THE INVENTION

One object of the instant disclosure is providing a manufacturing method of light emitting units. The manufacturing method is used to form a packaging structure having predetermined and simulated shapes by molding and cutting methods. The packaging structure is used to project lights in an asymmetric manner so as to meet the requirement of touch panels or touch screens.

The instant disclosure provides a manufacturing method of light emitting units. The method comprises steps of: providing a substrate, the substrate having a plurality of circuit areas and a light emitting device being disposed on each of the circuit areas; forming a packaging structure respectively corresponding to each of the circuit areas, the packaging structure covering the light emitting device; cutting the substrate along cutting lines on two axes to form separated and individual light emitting units, wherein the packaging structure has a top surface and two pair of side surfaces after the cutting step along cutting lines on two axes, the top surface is a biconic surface, and the cut packaging structure is a biconic lens structure; wherein each of the light emitting units has an asymmetric lighting pattern in two directions.

The instant disclosure provides a light emitting unit, which comprises a substrate having a circuit area thereon; a light emitting device disposed on the substrate and electrically connected to the circuit area; and a biconic lens structure having a top surface and two pair of side surfaces, the top surface is a biconic surface; wherein the light emitting unit has an asymmetric lighting pattern in two directions.

The instant disclosure provides a touch panel having a plurality of light emitting units and a plurality of receiving units corresponding to the light emitting units. Each of the light emitting units comprises a substrate having a circuit area thereon; a light emitting device disposed on the substrate and electrically connected to the circuit area; and a biconic lens structure having a top surface and two pair of side surfaces, the top surface is a biconic surface; wherein the light emitting unit has an asymmetric lighting pattern in two directions.

The cutting procedure is used to shape the packaging structure having especial optical structures. In other words, the molded original packaging structure is modified to a lens structure having biconic top surface by a cutting step. The cut lens structure is applied to project asymmetric lighting pattern in order to improve the detection distance of the touch panels. On the other hand, the brightness of the light emitting unit has enough intensity toward user's eyes to meet the requirement of applications.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Please refer to FIGS. 1, 1A-1B, 2 and 3; the present invention provides a manufacturing method of light emitting units. The present manufacturing method includes a cutting process to form a biconic lens structure 13 which cannot be directly formed by a molding process. In other words, the evaluated biconic lens structure 13 is calculated by an optical simulation computing software in advance and then the present method is provided for forming the biconic lens structure 13 because that the biconic lens structure 13 cannot be directly made or is difficult to be formed. The biconic lens structure 13 may be applied for light emitting units 1, such as side-view light emitting diodes, or touch panels. The side-view light emitting diode having the present biconic lens structure 13 can have an asymmetric lighting pattern in two directions. The manufacturing method of the instant disclosure at least has the following steps.

Figure 1:
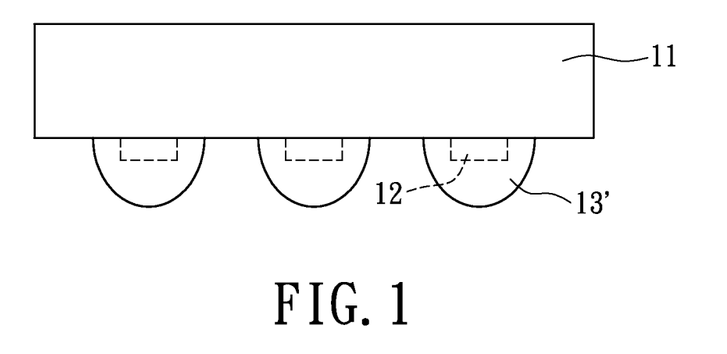
FIG. 1 shows the array of the light emitting units of the instant disclosure.
Figure 2:
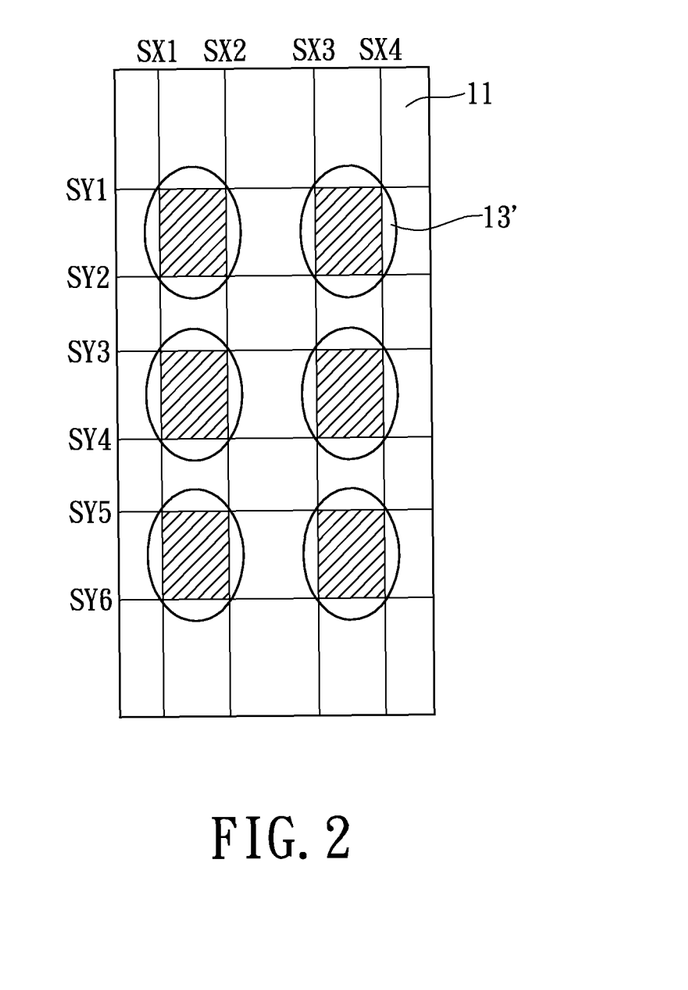
FIG. 2 shows the cutting lines defined on the array of the instant disclosure.
Figure 3:
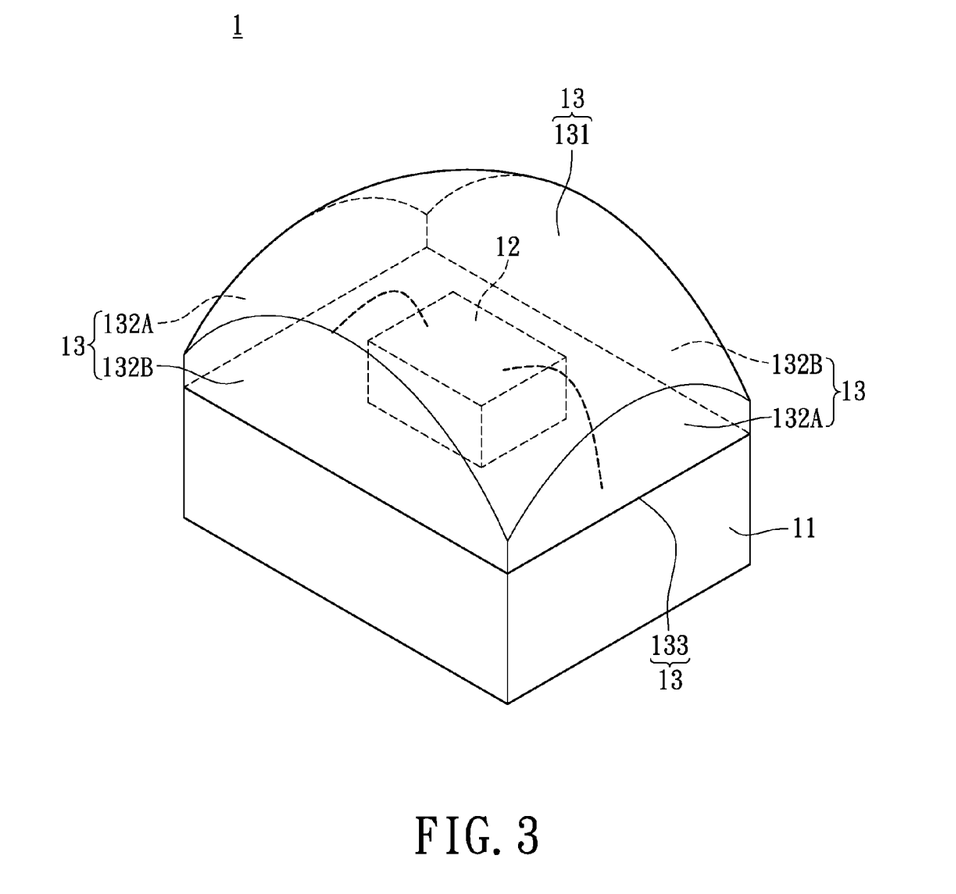
FIG. 3 shows a perspective view of the separated light emitting unit of the instant disclosure.

Step 1 is providing a substrate 11 which has a plurality of circuit areas (not shown) thereon and mounting a light emitting device 12 on each circuit area. In the exemplary embodiment, the substrate 11 has 3*2 array defined thereon as illustrated in FIGS. 1 and 2, and the substrate 11 is used to manufacture six separated and individual light emitting units 1 as shown in FIG. 3, but not restricted thereby. The light emitting device 12 is disposed on each circuit area by a die-attaching method or a wire-bonding method. In the exemplary embodiment, the light emitting device 12 may be a light emitting diode (LED) which is fixed on the circuit area by the die-attaching method and then the mounted LED is electrically connected to the circuit of the corresponding circuit area via conductive wires.

Figure 1A:
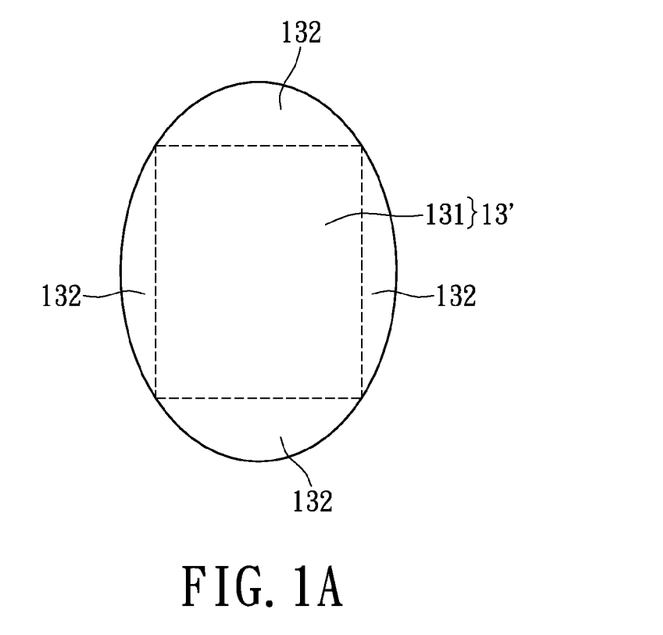
FIG. 1A shows the dome-shaped packaging structure of the instant disclosure.
Figure 1B:
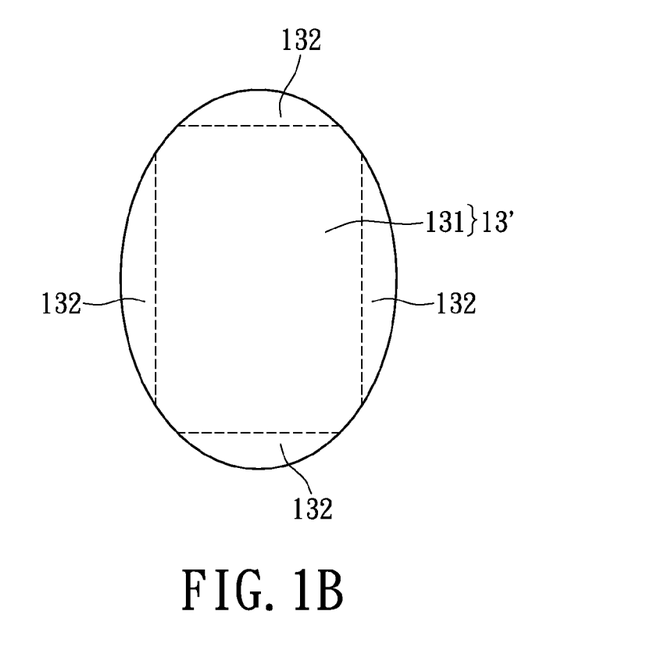
FIG. 1B shows another dome-shaped packaging structure of the instant disclosure.

Step 2 is forming a packaging structure 13' respectively corresponding to each of the circuit areas. The formed packaging structure 13' covers the light emitting device 12. Please refer to FIG. 1 again; a mold (not shown) is used to molding and curing a packaging colloid/packaging material so that the cured packaging structure 13' can cover the light emitting device 12 on the circuit area. The packaging material may be a thermoplastic material or a thermosetting material. In an embodiment, the thermoplastic transparent material has a main component of PPA (polyphthalamide resin) or PA (polyamide). The thermosetting material can be a transparent colloid having component of silicon or epoxy resin. Furthermore, the formed packaging structure 13' is molded as a dome-shaped packaging structure corresponding to the light emitting device 12, as shown in FIGS. 1A and 1B. The light emitting device 12 can emit red lights and the materials of the packaging structure 13' have properties to allow the red lights passing through. The packaging structure 13' has a top surface having a first surface area 131 and a second surface area 132 which are defined by the cutting lines (i.e., the dotted lines in FIGS. 1A and 1B). The first surface area 131 is a biconic surface and the second surface area 132 can be any type surface. The purpose of the second surface area 132 is to form a smooth dome-shaped surface together with first surface area 131, so that the resulted dome-shaped surface is able to be easily fabricated in mass production. The second surface area 132 is not a concerning surface because the second surface area 132 will be removed from the packaging structure 13' in the following cutting step. Without adding in second surface area 132, first surface area 131 is unable fabricated in mass production.

Step 3 is cutting the substrate 11 along cutting lines on two axes to form separated and individual light emitting units 1. After the cutting process, the first surface area 131 of the packaging structure 13' is remained and the second surface area 132 of the packaging structure 13' is removed. The original packaging structure 13' is cut to form as a biconic lens structure 13 which has a top surface 131 and two pair of side surfaces 132A, 132B. Please note that the first surface area 131 of the original packaging structure 13' is remained as the top surface 131 of the biconic lens structure 13 after the cutting process so that the top surface and the first surface area have the same numeral reference "131". As a result, the top surface 131 of the biconic lens structure 13 has the surface morphology of biconic surface which is designed on the top surface 131. As shown in FIG. 2, cutting tool is used to cut the packaging structure 13' along the defined cutting lines. Please note that two kinds of the cutting lines are respectively shown in FIGS. 1A and 1B.

The cutting step is provided not only for separating the individual light emitting units 1 but also for shaping the packaging structure 13' to the biconic lens structure 13. The lens structure 13 may be simulated by computer simulation software to calculate the cutting width between two adjacent cutting lines. As shown in FIG. 2, each biconic lens structure 13 is formed by two cutting procedures in a longitude direction, for example two pairs of cutting lines of SX1, SX2 and SX3, SX4 are used to determine the width of each biconic lens structure 13. Similarly, each biconic lens structure 13 is formed by two cutting procedures in a transverse direction, for example three pairs of cutting lines of SY1, SY2 and SY3, SY4 and SY5, SY6 are used to determine the length of each biconic lens structure 13. Accordingly, the second surface area 132 of the packaging structure 13' is removes after the cutting procedures in the longitude and transverse directions to form the biconic lens structure 13. On the other hand, the biconic lens structure 13 has a bottom surface 133 which is fixedly connected to the substrate 11. In the exemplary embodiment, the bottom surface 133 is a quadrilateral, such as a rectangle.

Please refer to FIG. 3; the separated single light emitting units 1 is shown. The side surfaces 132A, 132B are extending from the cut edges of the top surface 131. In other words, the biconic lens structure 13 has the top surface 131 with a biconic shape and two pairs of side surfaces 132A, 132B. The biconic top surface 131 is used to project the lights of the light emitting device 12 in an asymmetric lighting pattern in so that a small view angle is defined in a first direction and a large view angle is defined in a second direction. In a result of simulation, in the case that the ratio of the view angles in two directions of each of the light emitting unit 1 is larger than 1.5, the detection distance and the lightness of the light emitting unit 1 can meet the requirement of the IR touch panel. On the other hand, the first and second directions may be perpendicular to each other, for example, X and Y axes. Alternatively, the first and second directions may not be perpendicular to each other.

Figure 4:
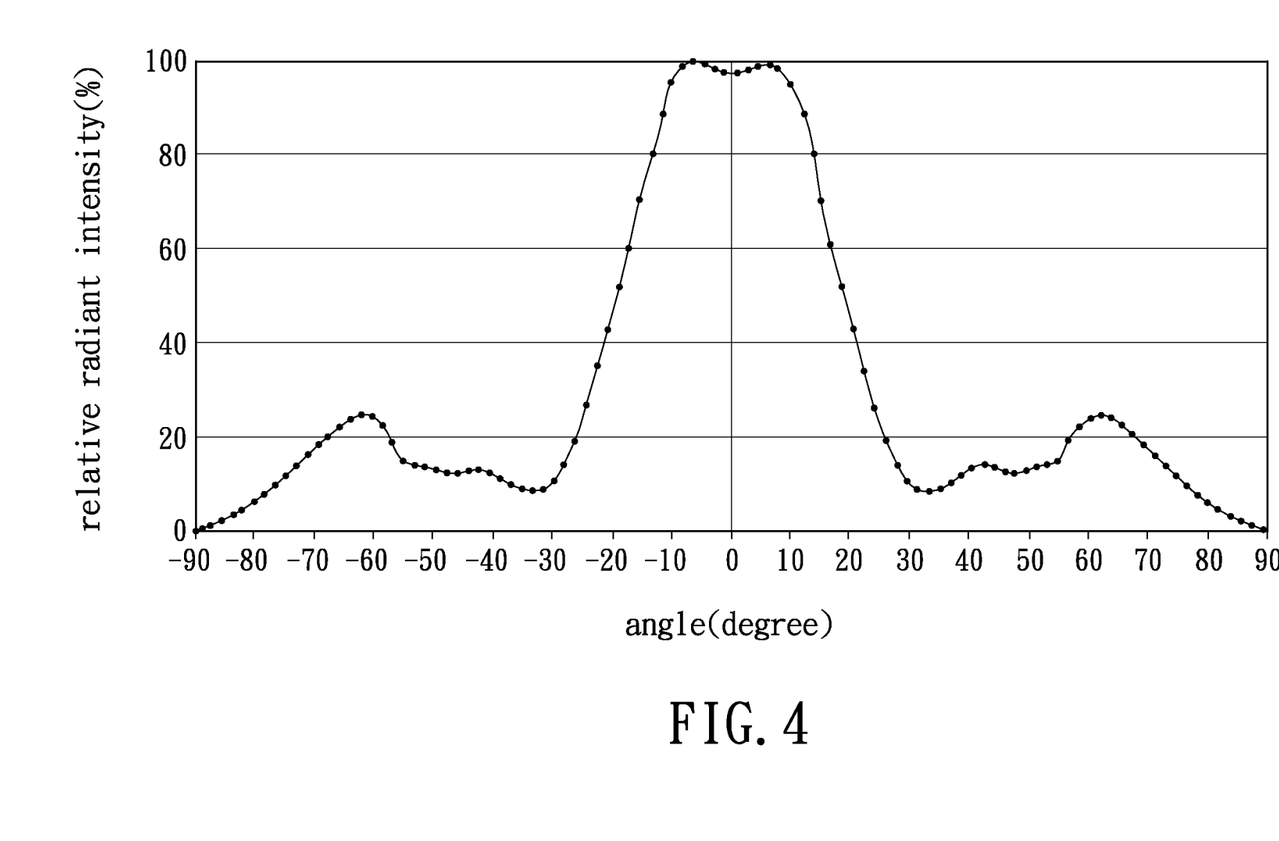
FIG. 4 shows the light pattern on the X-axis of the light emitting unit of the instant disclosure.
Figure 5:
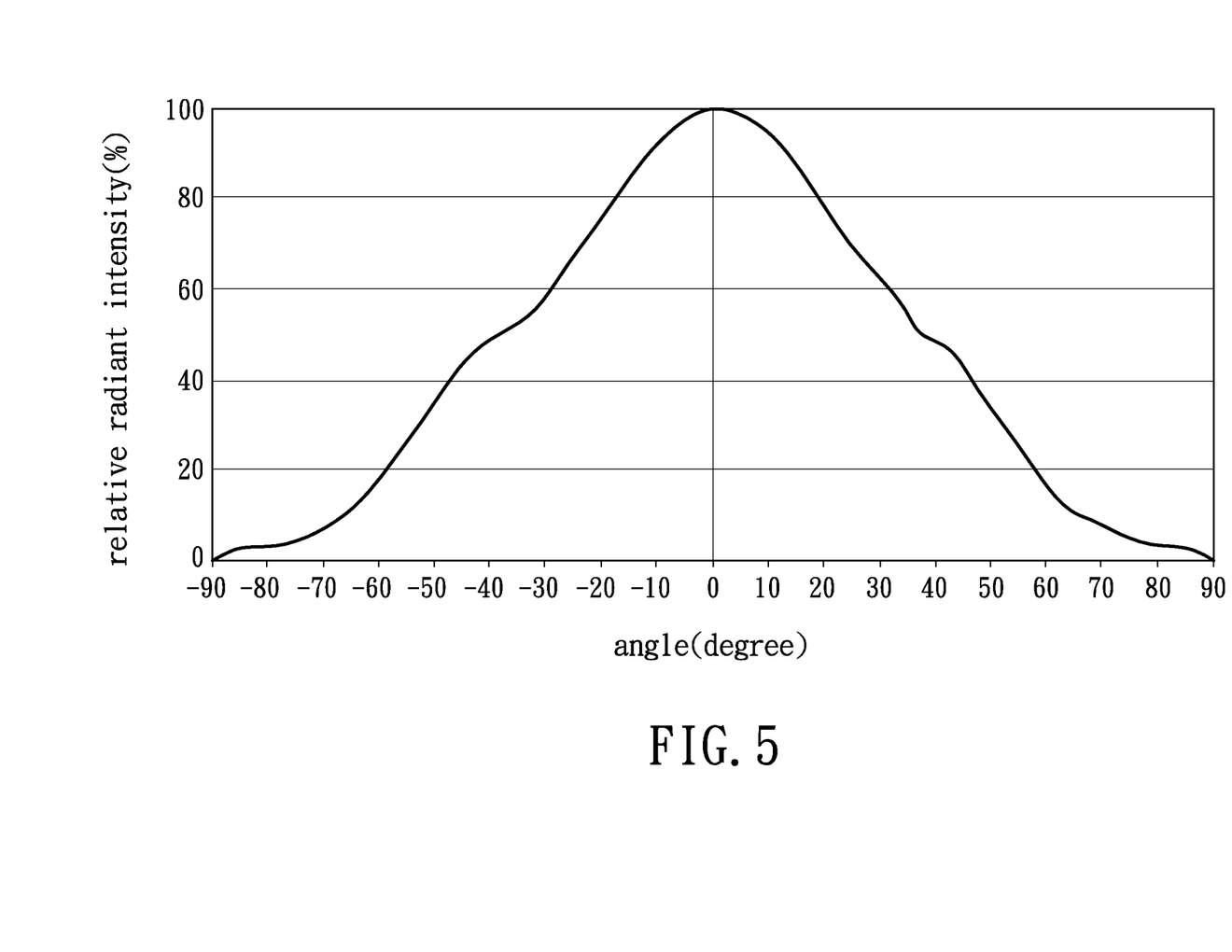
FIG. 5 shows the light pattern on the Y-axis of the light emitting unit of the instant disclosure.

Please refer to FIGS. 4 and 5; the asymmetric lighting pattern of the light emitting unit 1 is shown. The tested result of the view angle in the second direction (i.e., the X axis) is shown in FIG. 4, in which the view angle is less than 40 degrees. The tested result of the visible angle in the first direction (i.e., the Y axis) is shown in FIG. 5, in which the visible angle is larger than 80 degrees. In other words, the ratio of the view angles in two directions of each of the light emitting unit 1 is larger than 2 in this exemplary embodiment.

Figure 6:
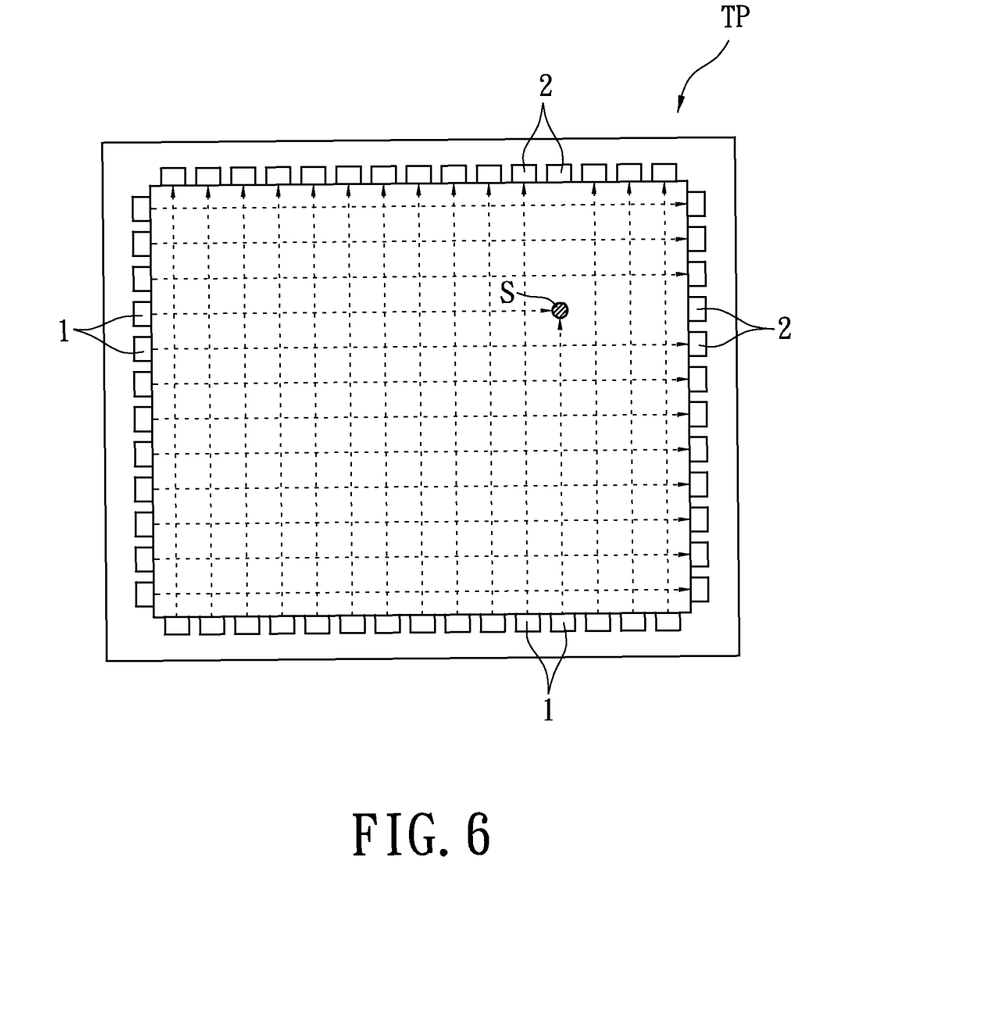
FIG. 6 shows the touch panel of the instant disclosure.

Please refer to FIG. 6; a touch panel "TP" is shown. In structural detail, the touch panel "TP" has a plurality of the present emitting units 1 and a plurality of receiving units 2 corresponding to the emitting units 1. The emitting units 1 and receiving units 2 are arranged on the four edges of the screen. When a triggering signal "S", such as the finger of a user, closes to the touch panel "TP", the lights projected from the emitting units 1 may be blocked by the finger; therefore, the position of the finger on the touch panel "TP" can be determined. In detail, because the light emitting units 1 are independent to each other, the position of the blocked lights can be determine the position of the finger on the touch panel "TP". Then the position of the finger can be used to control the terminals.

The present invention at least has the following characteristics.

1. The present method is used to form the biconic lens structure by a cutting procedure which is used to project lights in an asymmetric lighting pattern in two directions. As a result, the biconic lens structure having asymmetric lighting pattern is applied in touch panel to improve the detection distance and to reduce the signal cross-talking issue.

2. The light emitting units of the present invention has properties of asymmetric lighting pattern. In addition, the lightness in the direction having large view angle may compensate the lightness in the direction having low view angle; thus, the total lightness of the light emitting unit still meets the requirement of application.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A manufacturing method of light emitting units comprising steps of:
   providing a substrate, the substrate having a plurality of circuit areas and a light emitting device being disposed on each of the circuit areas;
   respectively forming a dome-shaped packaging structure to cover each of the light emitting devices on the circuit areas, each of the packaging structure comprising a biconic top surface having a central first curvature region and a surrounding second curvature region integrally formed around the first curvature region;
   singulating the packaging structures by cutting in the second curvature region of each biconic top surface through the substrate along two non-parallel axes to form separated and individual light emitting units,
   wherein the biconic top surface of each singulated packaging structure remains a bi-curvature profile;
   wherein each of the light emitting units has an asymmetric lighting pattern in two directions.

2. The manufacturing method as claimed in claim 1, wherein in the step of forming a packaging structure, a mold is used for forming a dome-shaped packaging structure to cover the light emitting device, and the curved top surface of the dome-shaped packaging structure has a first surface area and a second surface area, the first surface area is said biconic surface; the second surface area is a curved surface integrally connecting the edge of the first surface
   wherein in the step of cutting the substrate, the second surface area is removed from the dome-shaped packaging structure, and the remaining first surface area is cut to form as the top surface of the biconic lens structure.

3. The manufacturing method as claimed in claim 2, wherein before the step of cutting the substrate, the manufacturing method further comprises a step of calculating the cutting width between two adjacent cutting lines.

4. The manufacturing method as claimed in claim 1, wherein a ratio of the view angles in two directions of each of the light emitting unit is larger than 1.5.

5. A light emitting unit prepared by the steps as claimed in claim 1.

6. The light emitting unit as claimed in claim 5, wherein the biconic lens structure further has a bottom surface fixedly connected to the substrate, and the bottom surface is a quadrilateral.

7. The light emitting unit as claimed in claim 5, wherein the biconic lens structure is formed by cutting a dome-shaped packaging structure.

8. A touch panel having a plurality of light emitting units and a plurality of receiving units corresponding to the light emitting units, each of the light emitting units prepared by the steps as claimed in claim 1.

\* \* \* \* \*